United States Patent
Stenström

(10) Patent No.: US 6,483,683 B1
(45) Date of Patent: *Nov. 19, 2002

(54) OVERVOLTAGE PROTECTION

(75) Inventor: Helge Stenström, Stockholm (SE)

(73) Assignee: Telefonaktiebolaget LM Ericsson (publ), Stockholm (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/553,149

(22) Filed: Apr. 20, 2000

(30) Foreign Application Priority Data

Apr. 22, 1999 (SE) ................................. 9901483

(51) Int. Cl.$^7$ ................................. H02H 9/00
(52) U.S. Cl. .................. 361/91.1; 361/56; 361/100; 361/111
(58) Field of Search .................. 361/56, 58, 111, 361/113, 118, 127, 91.1, 100

(56) References Cited

U.S. PATENT DOCUMENTS

| 3,906,310 | A | * | 9/1975 | Esashika | ................. | 317/33 VR |
| 4,195,240 | A | * | 3/1980 | Otofuji | .................. | 307/362 |
| 5,404,333 | A |   | 4/1995 | Mehta | .................. | 365/208 |
| 5,491,437 | A |   | 2/1996 | Rincon et al. | .............. | 327/108 |

* cited by examiner

Primary Examiner—Stephen W. Jackson
(74) Attorney, Agent, or Firm—Nixon & Vanderhye

(57) ABSTRACT

A differential amplifier, of such as a comparator or operational amplifier, has two base input terminals. The base-emitter junctions in the two input transistors are protected by corresponding protective transistors connected as diodes, i.e., the emitter and base of each protective diode are connected. The effective pn-junction in the protective transistors is the junction between the base and collector which normally has a larger breakthrough voltage than the pn-junction between the base and emitter. The protective transistors may be made in substantially the same way as the input transistors with substantially the same electrical properties as the input transistors, and therefore, are quite practical for use in ICs.

6 Claims, 1 Drawing Sheet

OVERVOLTAGE PROTECTION

FIELD OF THE INVENTION

The invention relates to protection of differential input terminals of amplifiers and comparators, and in particular, to an amplifier of differential type having protected input terminals.

BACKGROUND

In many practical circuits comprising an operational amplifier, the voltage between the two input terminals of such an amplifier is very close to zero due to the fact that feedback is used and that the gain of an operational amplifier is very high. In contrast, a comparator is designed to provide an output signal representing the voltage between the two input terminals of the comparator and thus, in normal use in a circuit generally some voltage exists between the input terminals of the comparator. However, due to the exterior circuits providing signals to the input terminals the input voltage can become too large and destroy the comparator circuit If the feedback for an operational amplifier is not functioning properly, the amplifier can also be destroyed if the input voltage becomes too large. The feedback may be non-operative be cause a large voltage is provided to the input at the same time as "slew-rate"-limiting is made on the output terminal of the operational amplifier or because the output terminal of the operational amplifier is connected to a too great load. Therefore, protection circuits are require both for operational amplifiers, and in particular, for comparators. Comparators do not, in conventional circuits, have a mechanism limiting the voltage between the input terminals.

SUMMARY

It is an object of the present invention to provide a simple and efficient protection of the input terminals of an amplifier of differential type.

The two input terminals of a transistor-based amplifier of differential type are the base terminals of the input, active, amplifying transistors. The base-emitter junctions in the input transistors are protected by transistors connected as diodes in which the emitters and bases are connected to each other. The active pn-junctions in the protection transistors are the junctions between base and collector, which normally have a greater breakthrough voltage in the backward direction than the pn-junction between the base and the emitter. The protection transistors can advantageously be made in substantially the same way as the input transistors and have substantially the same electrical properties making it simple to introduce the protection in an electronic integrated circuit.

Thus an amplifier of differential type comprises two amplifier transistors. The input terminals of the amplifier are directly connected to the bases of each of the amplifier transistors for receiving the input voltage, the difference of which is to be produced and/or amplified and is obtained as an output voltage on an output terminal of the amplifier. The output voltage thus represents the voltage between the input terminals. Preferably, the output terminal is directly connected to the collector of one of the amplifier transistors.

For protection of the input terminals, and in particular, to prevent excessive currents from flowing through the amplifier transistors, protective diodes are connected directly in series with the emitter of each of the first transistors. Each of the protective diodes is connected to have the same direction or polarity as the diode formed by the pn-junction between the base and the emitter of the transistor to which it is connected. Furthermore, the protective diodes are formed by protective transistors, the emitter and the base of which are electrically connected to each other.

Generally, a protective diode is connected in series with that one of the pn-junctions in each of the amplifier transistors which has the lowest breakthrough voltage in the backward direction and has the same direction or polarity as the diode formed by the pn-junction of the first transistor having the lowest breakthrough voltage. The protective diodes each comprise a protective transistor of the same polarity type as the amplifier transistors, which in a differential amplifier generally are substantially identical or at least have substantially identical electrical characteristics or properties. That one of the first and second pn-junctions in each of the protective transistors which has the lowest breakthrough voltage in the backward direction is short-circuited by a electrical connection.

The amplifier transistors and the protective transistors can be npn-transistors of substantially the same kind or pnp-transistors of substantially the same kind.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIG. 7 is a circuit diagram of an amplifier according to FIG. 1 having the same protection of the input terminals as shown in FIG. 6a.

DETAILED DESCRIPTION

Hereinafter an amplifier circuit having some definite polarities of the components will be described. The amplifier circuit can be used with opposite polarities so that npn-transistors are replaced by pnp-transistors and vice versa, the directions of diodes are reversed, positive voltages become negative and vice versa, current directions are reversed, etc., provided that components are used which in other respects have corresponding or similar electric properties.

Figure 1:
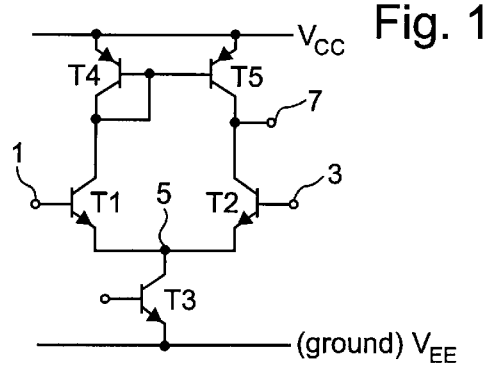
FIG. 1 is a circuit diagram of a simple transistor based differential amplifier.

In FIG. 1 a circuit diagram of a common form of input stage is shown, the input stage being illustrated as a differential amplifier suited to be used in for example comparators or operational amplifiers. The two input terminals 1, 3 of the circuit are constituted by the base terminals of two identical transistors T1 and T2 of for example npn-type as is shown in the figure. The emitters of the transistors T1, T2 are connected to each other at an emitter node 5 and are there connected to the collector of a third npn-transistor T3 which is biased by suitable voltages to work as a current source and thereby provides an emitter current to the input transistors T1 and T2. The emitter of the third transistor can as shown in the figure be connected to some supply voltage $V_{EE}$, for example a negative voltage a little offset from ground potential or the ground potential itself.

The collectors of the two amplifying or input transistors T1 and T2 are connected to a supply voltage $V_{CC}$, for example a positive constant voltage, in some suitable way, for example as is shown in the figure through a current mirror circuit. The current mirror circuit comprises two pnp-transistors T4 and T5, the bases of which are connected to each other and the emitters of which are connected to the supply voltage $V_{CC}$. The pnp-transistor T4 for the first input transistor T1 further has its base and its collector connected to each other so that it acts as a diode, whereas these two transistors T4 and T5 have their collectors coupled to the collectors of the respective input transistors T1 and T2. The important fact associated with the connection of the input transistors T1 and T2 to the drive voltage $V_{CC}$ is that the transistors T4 and T5 have an equivalent impedance and idling or no-load voltage (Thèvenin-equivalent) so that the input transistors T1 and T2 work in their active region, i.e., they are not saturated, and thus the voltages from their collectors to their bases always are positive. Thereby the transistors T4 and T5 in the current mirror can be replaced by resistors coupled between the collectors of the transistors and the positive supply voltage $V_{CC}$.

Figure 2:
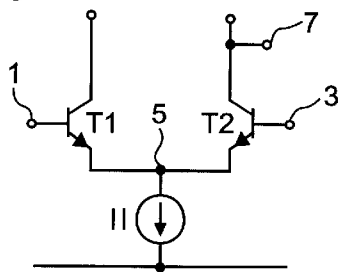
FIG. 2 is a simplified circuit diagram of the amplifier of FIG. 1 in which only some essential components are drawn.

A simplified embodiment of an input stage, shown partly schematically and comprising only the components essential in this context, are shown in FIG. 2. Here the transistor T3 is shown as a current generator I1, whereas the collectors of the input transistors T1 and T2 are only shown connected to generally denoted connection nodes.

The output signal of the two circuits shown in FIGS. 1 and 2 is in principle the collector current through either one of the input transistors T1, T2. A voltage representing this current can for example be extracted or retrieved at the terminal 7 of the collector electrode of the second input transistor T2.

When the voltage between the input terminals 1, 3 is small, the two input transistors T1, T2 are active and current flows through their emitter terminals to the common emitter node 5. The current through these transistors are determined by the current source I1 or the transistor T3 respectively and is distributed among them so that more current will flow through the input transistor which has the highest voltage on its input terminal, i.e. on its base. When voltage between the input terminals becomes sufficiently large, sufficiently large being taken to mean that the voltage is equally to some $V_T$, where $V_T$ is proportional to the absolute temperature and $V_T$ is about 26 mV at ambient temperature, the current through the input transistor, which has the lowest potential on its input terminal, can be neglected and the potential on the base or input terminal of the other input transistor is determined by the saturation current of this transistor. The voltage between the base and the emitter of this transistor is for saturation approximately given by $V_{BE}=V_T \cdot \log(I_1/I_S)$, where $I_1$ is the current generated by the current generator I1 and $I_S$ is the saturation current of the transistor.

Suppose now that the voltage on the input terminal 3 of the second input transistor T2 is maintained constant while the voltage on the second input terminal 1 of the first input transistor T1 is successively lowered. The voltage through the first input transistor T1 will then be lowered until the voltage of the emitter node is determined by the current of the current generator I1 and the saturation current $I_s$ of the input transistors. When the voltage is further reduced, the pn-junction between the base and emitter in the first input transistor T1 will be forwardly biassed to a smaller and smaller extent in order to then be reverse-biassed. When the voltage finally becomes sufficiently negative, current will again flow through the emitter of the first input transistor T1 but now in an opposite direction depending on the breakthrough voltage of said pn-junction being exceeded. All of this current then passes out through the first input terminal 1, i.e. the base of the first input transistor T1. The current is then no longer determined by the current source I1 but by the driving capability of the exterior voltage sources and by the resistances of the two input transistors T1 and T2. In any case, the current can destroy the two input transistors T1, T2 but perhaps primarily die first input transistor T1 in which the developed power becomes greatest. The voltage which an npn-transistor can allow between its emitter and base before the reverse-biassed pn-junction starts to conduct current varies between different manufacturing processes and different component layouts. For signal processing transistors usually this current is greater than about 6 V and smaller than about 10 V.

Generally, a bipolar transistor consists of three regions which are located at each other in a row and which often comprise layers located on top of each other, made of semiconductor material having alternating polarities so that a middle region and two exterior regions exist. A bipolar transistor can then be npn-type or pnp-type. A connection to exterior circuits is provided from each region which can also be called an electrode. The middle region is called the base and the two exterior regions comprise the collector and the emitter respectively. If voltages are applied to the terminals of an npn-transistor so that $V_c>V_b>V_e$ for an npn-transistor, and to a pnp-transistor, so that $V_c<V_b<V_e$, where $V_c$, $V_b$, $V_e$ are the potentials on the collector, base and emitter respectively of the transistors, and if a not too large current is supplied to the base which should also be positive for an npn-transistor and negative for a pnp-transistor, the current through the collector of the transistor is controlled by the supplied base current. Roughly, the collector current can be proportional to the base current. The constant of proportionality is called BF, "forward current gain", also denoted by $\beta$.

An arbitrary one of the two exterior regions of bipolar transistor could then be called the emitter whereas the other region then is the collector of the transistor. Usually however, the collector and emitter are defined so that the constant $\beta$ of proportionality becomes as large as possible. For the same polarities of the applied voltages, if the transistor is turned around so that the collector will be located where the emitter previously was located, it is possible to measure a corresponding constant of proportionality or current gain factor BR, "reverse current gain". Usually BF is much larger than BR. This fact depends on several optimizations of the layout or structure of the transistors, these optimizations considering among other things that it is desirable to have a BF which is as large as possible. i.e. one of the gain factors should be given the highest possible value. The value of BR has less importance.

Usual values are BF=50–100 and BR=0.5–10. It is important to observe that an obvious condition of using a transistor in an amplifier circuit is that it has a current gain factor larger than one.

Figure 3:
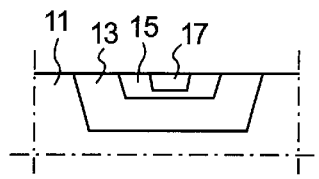
FIG. 3 is a schematic cross sectional view of a vertical non-transistor.

The most common embodiment of an npn-transistor in integrated circuits is a vertical transistor, as illustrated by the cross-sectional schematic view of FIG. 3. In some outer material 11, having a low doping of the same type as the base, layers are provided which form the parts or regions of the transistor. The collector 13 is the lowermost layer having a doping opposite that of the outer material. Centrally in this lowermost layer another layer 15 is located forming the base and centrally in the base region a further layer 17 is located forming the emitter, so that in the center of structure, a layer sequence is obtained comprising, from the bottom and upwards, collector, base and emitter. The different regions extend at the exterior edges up to the surface of the structure for exterior electrical connection. Such a transistor is made so that the doping levels are decreasing in the order emitter-base-collector, i.e., the emitter region has a higher doping than the base region and the base region has a higher doping than the collector region. Furthermore, the base layer 15 is very thin at the centre of the structure and the collector layer is relatively thick. This contributes to the desired properties comprising a high current gain factor BF and good high frequency properties. The same properties also result in that the breakthrough voltage $BV_{cb}$, when the collector-base-junction is reverse-biased, becomes significantly higher than the breakthrough voltage $BV_{eb}$, when the emitter-base-junction is reverse-biased. In manufacturing processes which have been optimized therefor often the breakthrough voltage $BV_{cb}$ between collector and base is of the magnitude of order 50–120 V, which is to be compared to the breakthrough voltage $BV_{eb}$ of 6–12 V for the emitter-base-junction. Such manufacturing processes are used in applications which require that the circuits can stand high voltages, for example in circuits for audio amplifiers, voltage converters, electronic circuits for vehicles, etc.

Figure 4:
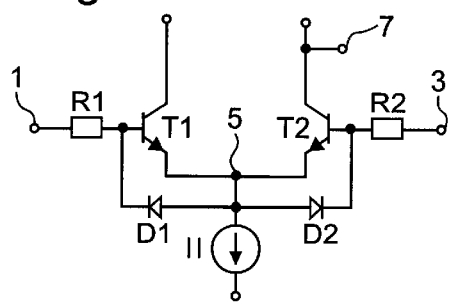
FIG. 4 is a circuit diagram of a differential amplifier having protection of the input terminals.

A previously known way of protecting the input stage as described above comprises connecting resistors R1, R2 at the input terminals in series with the base terminals of the input transistors T1, T2 according to FIG. 4. Thereby the base currents are limited. Furthermore, diodes Di, D2 can be connected between the emitters and bases of these transistors so that these diodes conduct in a direction opposite the base-emitter-diode in each transistor. Thus, when the backward voltage between emitter and base of one of the transistors T1, T2 exceeds the forward voltage for the corresponding exterior diode D1, D2 connected antiparallel, the forward voltage being about 0.6 to 1 V, the current will be conducted through the exterior diode instead of being conducted through the respective transistor. An advantage of such a circuit solution comprising protective components is that the transconductance of the input stage in normal operation is not effected by the added protective components.

Figure 5A:
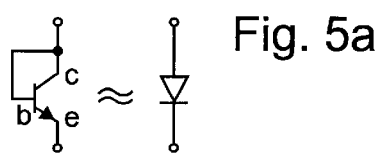
FIG. 5a is a picture which illustrates the equivalence between a transistor, the base and collector of which are directly electrically connected to each other, and a diode.
Figure 5B:
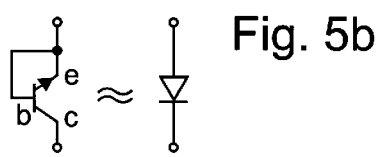
FIG. 5b is a picture illustrating the equivalence between a transistor, the base and emitter of which are directly electrically connected to each other, and a diode.

It is well known that in manufacturing integrated circuits, when in the manufacturing process only transistors are available, diodes are obtained by connecting the base and collector of a transistor to each other, see FIG. 5a. Due to the two pn-junctions existing in a transistor obviously also a component having a diode function is obtained in the case where the base and emitter of the transistor are connected to each other, see FIG. 5b. However, such a diode component is seldom used, since it has inferior properties for most applications compared to a diode obtained by connecting the collector and the base of a transistor to each other.

However, by using a bipolar transistor in an unconventional way, it is possible to obtain a protection of the input terminals of differential amplifiers as described above. As has been mentioned above, in a transistor in most cases a high current gain is desired. In the application described hereinafter this is not necessary.

Figure 6A:
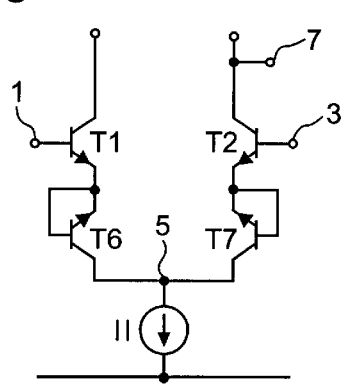
FIG. 6a is a circuit diagram of an amplifier according to FIG. 2 having protection of the input terminals, the protection being obtained by as transistors connected as diodes.
Figure 7:
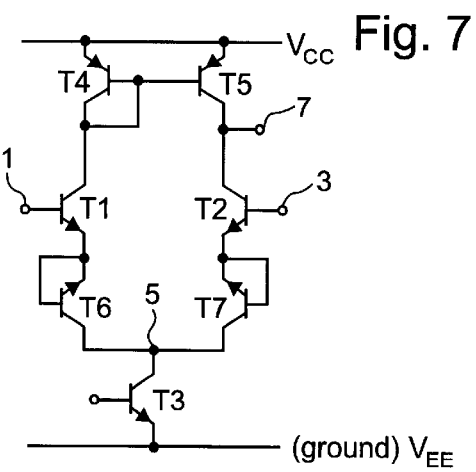

In FIG. 6a a principle circuit diagram of a differential amplifier is shown which is constructed substantially as the amplifier shown in FIGS. 1 and 2 and which has protection of the input terminals. A more complete circuit diagram is shown in FIG. 7. This circuit solution has two npn-transistors T6, T7 connected between the emitters of the input transistors T1, T2 and the common emitter node 5. These transistors have their base terminals connected to the respective emitter terminals so that only the base-collector-diode is used. They are connected so that the emitter in a normal operation of the amplifier has a higher potential then the collector-base, e.g. the base-collector-diode is forwardly biassed.

If, in the same way as has been discussed above, the input voltage on the base 3 of the second input transistor T2 is maintained constant while the voltage on the other input terminal 1, i.e., the voltage on the base of the first input transistor T1, is gradually reduced, again firstly the current through the first transistor is reduced to zero. After some further reduction of the input voltage current will flow "backwards" in the direction from the emitter to the base in the first transistor T1 but now it will start to flow until the voltage between the node 5 and the input terminal 1 exceeds the sum of the breakthrough voltage $BV_{eb}$ between the emitter and base of the transistor T1 and the breakthrough voltage $BV_{ce}$ between the collector and emitter of the protective transistor T6. The breakthrough voltage $BV_{ce}$ between the collector and the emitter in a transistor is considerably, i.e., many times, larger than the breakthrough voltage $BV_{eb}$ between the emitter and base in the same transistor and is further of the same magnitude of order as the breakthrough voltage $BV_{cb}$ between the collector and base, as has been defined above. In the protected circuit solution according to FIG. 4, the current surge in the input transistor T1 occurs when the voltage between the node 5 and the input terminal 1 exceeds the breakthrough voltage $BV_{eb}$ between the emitter and the base of the input transistor.

Figure 6B:
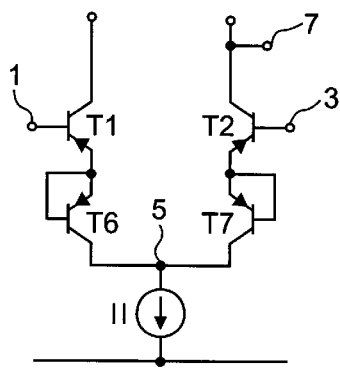
FIG. 6b is circuit diagram similar to that of FIG. 6a for transistors of other polarities.

In FIG. 6b, a principle circuit diagram of a differential amplifier, similar to that of FIG. 6a, npn-transistors are used both as amplifying or active elements and as protective elements. This circuit operates in basically the same way as the circuit illustrated in FIGS. 6a and 7.

The advantage of the circuit solution according to FIGS. 6a and 7 or FIG. 6b is thus that the circuit can stand voltages which are many times higher as compared to the case without protective components. Compared to the solution according to FIG. 4 two advantages exist. In FIG. 4, a current passes through the protective components R1, R2, D1, D2, when the protection becomes operative. Such a non-controlled current can, among other things, result in overheating. This is not the case for the solution according to FIGS. 6a and 7. Furthermore, resistors are often not suited to be integrated in monolithic integrated circuits, either due to the fact that the manufacturing process in itself is not suited for manufacturing resistors or due to the fact that they occupy a too large area. In integrated circuits resistors are longer the larger resistance. Since the widths of the resistors are not allowed to be smaller than a definite, smallest measure determined by mask production, optical resolution, etc. and the resistance is determined by the ratio of the length and the width, resistors having high resistance values require a greater length, and thereby, large areas. In the protective circuit according to FIG. 4, the power generation in the resistors R1, R2 can become significant in the case where the other component in circuits, not shown, feeding the input terminals of the amplifier circuit allow it.

The transistors T6, T7 connected as diodes in the circuit according to FIGS. 6a, 6b and 7 influence the transconductance of the differential amplifier. This can be an advantage or disadvantage. Thus, in some previously known circuits resistors can be used is connected at the positions of the protective transistors T6, T7 to lower the transconductance.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. Apparatus comprising:

first and second PNP transistors, each having an emitter, a base, and a collector and an input terminal electrically connected to the base, where the emitters are electrically connected together;

an output terminal connected to one of the collectors to provide an output voltage representing a voltage between the input terminals;

first and second protective PNP transistor diodes, each transistor diode having an emitter, base, and collector with the emitter being electrically connected to the base, wherein the emitter of the first PNP transistor is directly electrically connected to the emitter of the first protective PNP transistor diode and the emitter of the second PNP transistor is directly electrically connected to the emitter of the second protective PNP transistor diode.

2. The apparatus in claim 1, wherein the first and second PNP transistors and the first and second PNP protective transistor diodes have substantially the same electrical properties.

3. The apparatus in claim 1, wherein for each of the first and second protective PNP transistor diodes, a PN junction between the emitter and the base has a lower breakdown voltage than a PN junction between the emitter and the collector.

4. Apparatus comprising:

first and second NPN transistors, each having an emitter, a base, and a collector and an input terminal electrically connected to the base, where the emitters are electrically connected together;

an output terminal connected to one of the collectors to provide an output voltage representing a voltage between the input terminals;

first and second protective NPN transistor diodes, each transistor diode having an emitter, base, and collector with the emitter being electrically connected to the base, wherein the emitter of the first NPN transistor is directly electrically connected to the emitter of the first protective NPN transistor diode and the emitter of the second NPN transistor is directly electrically connected to the emitter of the second protective NPN transistor diode.

5. The apparatus in claim 4, wherein the first and second PNP transistors and the first and second PNP protective transistor diodes have substantially the same electrical properties.

6. The apparatus in claim 4, wherein for each of the first and second protective PNP transistor diodes, a PN junction between the emitter and the base has a lower breakdown voltage than a PN junction between the emitter and the collector.

* * * * *